United States Patent [19]
Vallancourt

[11] Patent Number: 5,689,260
[45] Date of Patent: Nov. 18, 1997

[54] ANALOG-TO-DIGITAL CONVERTER USING SCALED SIGNAL TO INITIALIZE COARSE CONVERSION CIRCUIT

[75] Inventor: David Gerard Vallancourt, Macungie, Pa.

[73] Assignee: Lucent Technologies Inc., Murray Hill, N.J.

[21] Appl. No.: 532,857

[22] Filed: Sep. 22, 1995

[51] Int. Cl.⁶ .................................................. H03M 1/14
[52] U.S. Cl. ................................... 341/156; 341/158
[58] Field of Search ..................................... 341/155, 156, 341/158, 159

[56] References Cited

U.S. PATENT DOCUMENTS

| | | | |
|---|---|---|---|
| 4,074,260 | 2/1978 | Butler et al. | 340/347 |
| 4,733,217 | 3/1988 | Dingwall | 340/347 |
| 4,893,124 | 1/1990 | Tsuji et al. | 341/156 |
| 4,926,176 | 5/1990 | Lewyn et al. | 341/135 |
| 4,942,399 | 7/1990 | Buchholtz et al. | 341/143 |
| 4,951,053 | 8/1990 | DesJardin et al. | 341/136 |
| 4,978,959 | 12/1990 | Chong et al. | 341/161 |
| 5,006,853 | 4/1991 | Kiriaki | 341/156 |
| 5,353,027 | 10/1994 | Vorenkamp et al. | 341/156 |
| 5,369,406 | 11/1994 | Hughes | 341/135 |
| 5,489,904 | 2/1996 | Hadidi | 341/156 |

FOREIGN PATENT DOCUMENTS

| | | | |
|---|---|---|---|
| 2190258 | 11/1987 | United Kingdom | 341/156 |
| 92008288 | 5/1992 | WIPO | 341/156 |

OTHER PUBLICATIONS

D.W.J. Groeneveld et al.,"A Self-Calibration Technique for Monolithic High-Resolution D/A Converters", *IEEE Journal of Solid-State Circuits*, vol. 24, No. 6, Dec. 1989, pp. 1517–1522.

D.G. Vallancourt, "The Making of Animal 2" *Internal AT&t Memoradum*, Apr. 18, 1995, Describes a prior art current-mode A/D converter.

*Primary Examiner*—Jeffrey A. Gaffin
*Assistant Examiner*—Jason H. Vick
*Attorney, Agent, or Firm*—David M. Sigmond; John P. Veschi

[57] ABSTRACT

An analog-to-digital converter includes a coarse conversion circuit, a fine conversion circuit, a scaling circuit, and a logic circuit. An analog input signal is applied to the scaling circuit which provides a scaled signal. The scaled signal is applied to the fine conversion circuit which provides a digital control signal. The digital control signal is applied to the coarse conversion circuit for initializing the coarse conversion circuit. Thereafter, the analog input signal is applied to the initialized coarse conversion circuit which provides a first digital code and a reference signal associated with the first digital code. A remainder signal is determined at least in part by the difference between the analog input signal and the reference signal. The remainder signal is applied to the fine conversion circuit which provides a second digital code. The logic circuit determines a digital output signal, representing the analog input signal, in response to at least the first and second digital codes.

25 Claims, 3 Drawing Sheets

ANALOG-TO-DIGITAL CONVERTER USING SCALED SIGNAL TO INITIALIZE COARSE CONVERSION CIRCUIT

FIELD OF THE INVENTION

The invention relates to analog-to-digital converters, and more particularly to analog-to-digital converters using coarse and fine conversion circuits.

DESCRIPTION OF RELATED ART

Analog-to-digital (A/D) converters are well known in the art and used in a variety of applications whenever an analog input signal must be converted into a digital output signal. Such conversion is necessary to interface real-world systems, which typically include continuously varying analog signals, with digital systems.

A very large number of A/D converters are available from manufacturers and described in the literature. General categories of A/D converters include comparator (flash) converters, successive approximation converters, and counting converters. Major factors that determine the quality of an A/D converter include the analog signal range, input impedance, sampling rate, accuracy, stability, conversion time, power consumption, and space requirements on an integrated circuit chip.

Two-step A/D converters may employ coarse and fine conversion circuits. In a first step, the coarse conversion circuit performs A/D conversion on an analog input signal and generates a first digital code. The coarse conversion circuit also generates a reference signal associated with the first digital code. A remainder signal is associated at least in part with the difference between the analog input signal and the reference signal. The remainder signal represents a portion of the analog input signal that is too small to be evaluated by the coarse conversion circuit. In a second step, the fine conversion circuit performs A/D conversion on the remainder signal and generates a second digital code. The first and second digital codes, and perhaps other digital codes, are applied to a logic circuit which provides a digital output signal.

In some two-step converters, the first digital code corresponds to the most significant bits (MSBs) of the digital output signal, the second digital code corresponds to the least significant bits (LSBs) of the digital output signal, and the first and second digital codes are concatenated to provide the digital output signal. In other two-step converters, the digital output signal is determined by the first digital code, the second digital code, and one or more additional digital codes related, for instance, to over-ranging or error correction. In this instance, the MSBs and LSBs are each a function of all these digital codes.

Unfortunately, the coarse conversion circuit may consume a relatively large amount of power. As a result, there is a continuing need for improved two-step A/D converters with reduced power dissipation as well as other improvements to the factors listed above.

SUMMARY OF THE INVENTION

A primary aspect of the invention is an analog-to-digital converter which converts a scaled analog input signal into a digital control code for initializing a coarse conversion circuit.

In one embodiment of the invention, an analog-to-digital converter includes a coarse conversion circuit, a fine conversion circuit, a scaling circuit, and a logic circuit. An analog input signal is applied to the scaling circuit which provides a scaled signal. The scaled signal is applied to the fine conversion circuit which provides a digital control signal. The digital control signal is applied to the coarse conversion circuit for initializing the coarse conversion circuit. Thereafter, the analog input signal is applied to the initialized coarse conversion circuit which provides a first digital code and a reference signal associated with the first digital code. A remainder signal is determined at least in part by the difference between the analog input signal and the reference signal. The remainder signal is applied to the fine conversion circuit which provides a second digital code. At least the first and second digital codes are applied to the logic circuit which determines a digital output signal, representing the analog input signal.

In other embodiments of the invention, the coarse conversion circuit includes N substantially matched current sources. The coarse conversion circuit is initialized by coupling P (in the range of 0 to N) current sources to a summing node, where P is related to the digital control signal. Preferably, the digital control signal is an approximation of the MSBs of the digital output signal. The P current sources provide a relatively close match with the analog input signal before the coarse conversion begins. As a result, the coarse conversion tends to require less time and consume less power. The coarse conversion includes applying the analog input signal to the summing node, and coupling and decoupling various current sources to and from the summing node by incremental search to provide a close match with the analog input signal. The first digital code corresponds to S (in the range of 0 to N) current sources coupled to the summing node after the close match with the analog input signal occurs. The fine conversion circuit includes a binary-weighted current splitter coupled between one of the current sources and the summing node. The fine conversion includes applying the remainder signal to the summing node, coupling the current splitter to the summing node, and operating the current splitter by successive approximations to adjust the current between the one current source and the summing node to provide a close match with the remainder signal. The second digital code is related to the settings of the current splitter when the close match with the remainder signal occurs.

BRIEF DESCRIPTION OF THE DRAWING

The invention, together with its various features and advantages, can be readily understood from the following detailed description taken in conjunction with the accompanying drawing, in which.

DETAILED DESCRIPTION

Figure 1:
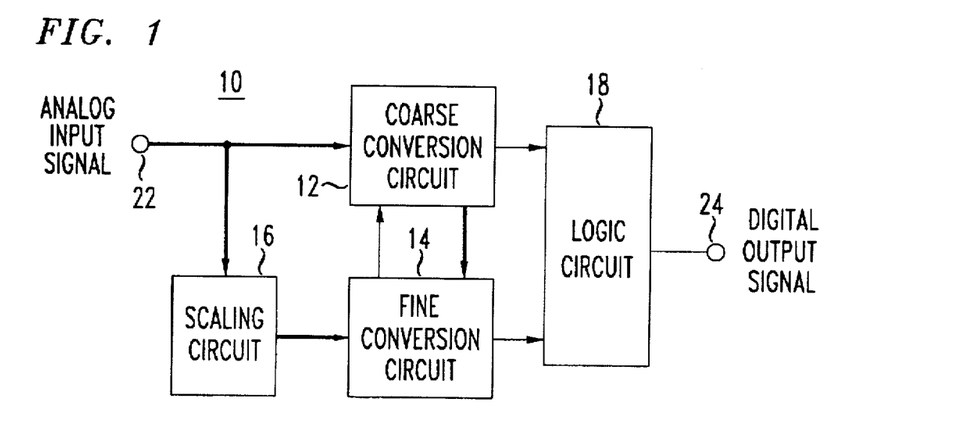
FIG. 1 is a simplified schematic diagram illustrating an embodiment of the invention.

FIG. 1 is a simplified schematic diagram illustrating an embodiment of the invention. Analog-to-digital converter 10 converts an analog input signal into a digital output signal. A/D converter 10 includes coarse conversion circuit 12, fine conversion circuit 14, scaling circuit 16, and logic circuit 18. Preferably, coarse conversion circuit 12 is a current-mode A/D converter which converts analog signals within a first current range into output signals subject to a first quantization error, fine conversion circuit 14 is a current-mode A/D converter which converts analog signals within a second current range into output signals subject to a second quantization error, and the second current range is approximately equal to the first quantization error. The signal paths shown as thick lines carry analog current signals, the signal paths shown as thin lines carry digital signals.

In operation, an analog input signal at input port 22 is applied to scaling circuit 16. Scaling circuit 16, in response to the analog input signal, provides an analog scaled signal to fine conversion circuit 14. The scaled signal has a smaller amplitude than the analog input signal. Preferably, the scaled signal is linearly proportional to the analog input signal, and the scaled signal is limited to the second current range. Fine conversion circuit 14, in response to the scaled signal, provides a digital control signal to coarse conversion circuit 12. (It is understood that a separate initialization conversion circuit, rather than fine conversion circuit 14, can be used to provide the digital control signal). The digital control signal is used to initialize coarse conversion circuit 12. Preferably, the digital control signal is an approximation of the MSBs associated with the analog input signal. In this manner, coarse conversion circuit 12 is provided with information about the analog input signal before the coarse conversion begins. Coarse conversion circuit 12 uses this information to perform the coarse conversion more efficiently. For example, if coarse conversion circuit 12 searches for a close match (i.e., within the first quantization error) with the analog input signal, then the information can be used to initialize coarse conversion circuit 12 to a relatively close match (i.e., within a few first quantization errors) with the analog input signal before the search begins. Thereafter, the search should provide the close match in a relatively short time. The relatively short search time tends to reduce power dissipation during coarse conversion. Furthermore, in some instances, the coarse conversion may be performed without a search.

Once coarse conversion circuit 12 is initialized in accordance with the invention, the remaining operations of A/D converter 10 are conventional unless otherwise noted. The analog input signal is applied from input port 22 to coarse conversion circuit 12. Preferably, the analog input signal is within the first current range. Coarse conversion circuit 12, in response to the analog input signal, provides a first digital code, and an analog reference signal associated with the first digital code. Although coarse conversion circuit 12 would conventionally perform a search, initializing coarse conversion circuit 12 in accordance with the invention permits coarse conversion to occur without a search if desired. An analog remainder signal is subsequently determined at least in part by the difference between the analog input signal and the reference signal. For example, the remainder signal may be a function of both this difference, and an over-ranging operation which results in an over-ranging digital code. Coarse conversion circuit 12 applies the remainder signal to fine conversion circuit 14. Preferably, the remainder signal is within the second current range. Fine conversion circuit 14, in response to the remainder signal, provides a second digital code. Coarse conversion circuit 12 and fine conversion circuit 14 apply the first and geCond digital codes, respectively, to logic circuit 18. Logic circuit 18, in response to at least the first and second digital codes, determines a digital output signal representing the analog input signal. Logic circuit 18 may determine the digital output signal, for instance, in response to the first and second digital codes and an over-ranging digital code. The digital output signal is sent to output port 24.

Figure 2:
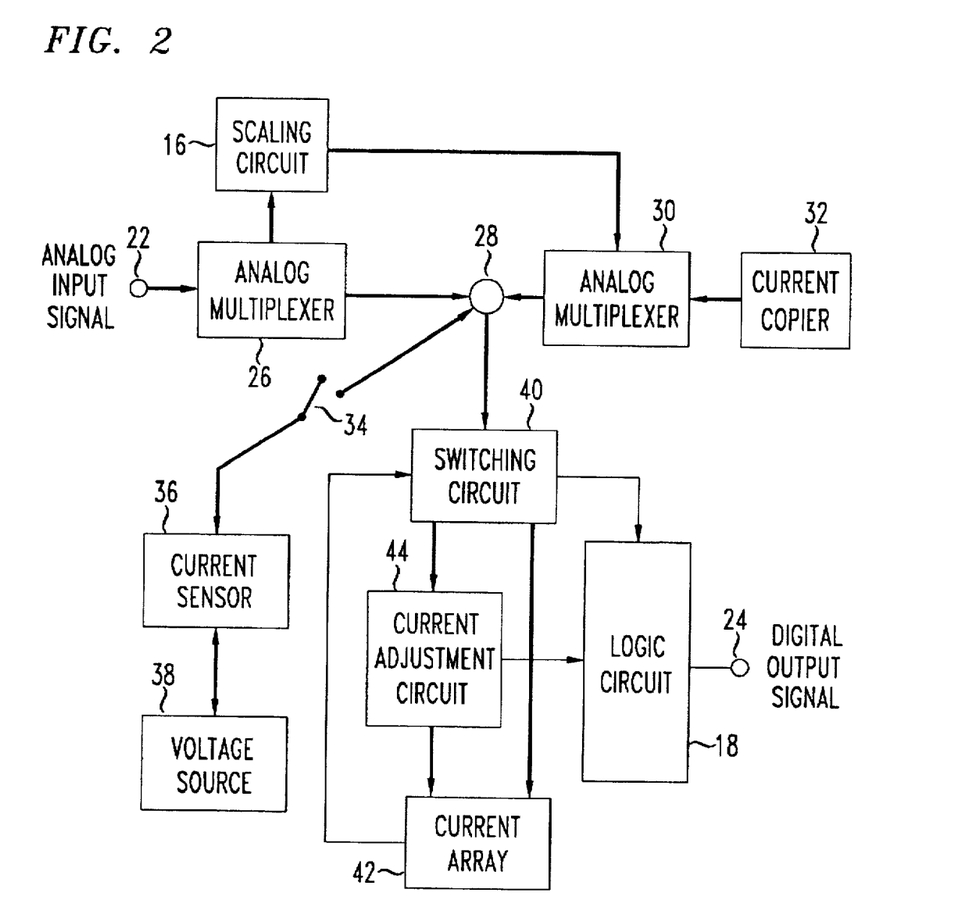
FIG. 2 is a simplified schematic diagram illustrating an embodiment of FIG. 1.

FIG. 2 is a simplified schematic diagram illustrating an embodiment of FIG. 1. Analog multiplexer 26 is used for coupling and decoupling input port 22 to and from scaling circuit 16 and/or summing node 28. Likewise, analog multiplexer 30 is used for coupling and decoupling summing node 28 to and from scaling circuit 16 and/or current copier 32. Switch 34 is used for coupling and decoupling the series combination of current sensor 36 and voltage source 38 to and from summing node 28. Voltage source 38 provides a substantially constant voltage, and current sensor 36 indicates the direction of current flow between voltage source 38 and summing node 28. Switching circuit 40 includes N switches, and current array 42 includes N current sources. The N switches are used for coupling and decoupling respective current sources to and from summing node 28. Preferably, the current sources are substantially matched. Current adjustment circuit 44 is coupled between G current sources (where G is in the range of 1 to N) and switching circuit 40. Current adjustment circuit 44 is used for adjusting the current flow between the G current sources and summing node 28 when switching circuit 40 couples current adjustment circuit 44 to summing node 28. The signal paths shown as thick lines carry analog current signals, the signal paths shown as thin lines carry digital signals. For illustration purposes, analog multiplexers 26 and 30 inject current (such as from the analog input signal, the scaled signal, or whatever signal is provided from current copier 32) into summing node 28, whereas current array 42 draws current from summing node 28 through switching circuit 40. The direction of current flow between voltage source 38 and summing node 28 may be in either direction.

During operation, the analog input signal at input port 22 is routed by multiplexer 26 to scaling circuit 16, and the scaled signal is routed by multiplexer 30 to summing node 28. Preferably, the scaled signal is linearly proportional to the analog input signal divided by approximately N. In addition, switch 34 couples voltage source 38 to summing node 28, and switching circuit 40 couples current adjustment circuit 44 to summing node 28. This creates a first difference signal between voltage source 38 and summing node 28 representing a difference between the scaled signal and the current between the G current sources and summing node 28 through current adjustment circuit 44. Preferably, the G current sources draw the maximum current of the second current range, and current adjustment circuit transfers some portion of this current to summing node 28. Current adjustment circuit 44, in communication with current sensor 36, adjusts the current that the G current sources draw from summing node 28 in order to reduce the first difference signal. After the first difference signal is so reduced, the current between the G current sources and summing node 28 is close match with the current of the scaled signal. The settings of current adjustment circuit 44 are used to provide a corresponding M-bit digital control signal, which is an approximation of the MSBs of the analog input signal.

The digital control signal is transferred to switching circuit 40, and switching circuit 40 couples P current sources to summing node 28 (where P is in the range of 0 to N), such that P corresponds to the digital control signal. This provides initialization for the coarse conversion. That is, current array 42 is initialized to draw current from summing node 28 that is an estimate of, or relatively close match with the current of the analog input signal.

The remaining operations for FIG. 2 are conventional unless noted otherwise. Analog multiplexer 26 routes the analog input signal to summing node 28, and analog multiplexer 30 decouples both scaling circuit 16 and current copier 32 from summing node 28. Switch 34 remains closed. Accordingly, a second difference signal between voltage source 38 and summing node 28 represents a difference between the analog input signal and the P current sources. Although the P current sources provide a relatively close match with the analog input signal, the P current sources may not provide a close match. In particular, given a relatively simple scaling circuit 16, the scaled signal may not correspond exactly to the analog input signal divided by N. Furthermore, the analog input signal may vary after the digital control signal is provided but before the coarse conversion begins. Therefore, for illustration purposes, switching circuit 40, in communication with current sensor 36, performs an incremental (thermometer) search by coupling and decoupling various current sources to and from summing node 28 until a close match is found.

The incremental search is determined by the direction of current flow between voltage source 38 and summing node 28. If the second difference signal flows from voltage source 38 to summing node 28, then current sensor 36 instructs switching circuit 40 to decouple one of the current sources that is coupled to summing node 28. Likewise, if the second difference signal flows from summing node 28 to voltage source 38, then current sensor 36 instructs switching circuit 40 to couple one of the current sources that is alecoupled from summing node 28. Assuming the analog input signal has a sufficiently low slew rate in comparison to the rate at which the current sources are coupled and decoupled from summing node 28, eventually the search will toggle between coupling and decoupling a single current source to and from summing node 28, indicating a close match (i.e., within one current source) between the analog input signal and the current sources coupled to summing node 28. For illustration purposes, after the close match (and perhaps an over-ranging operation) is performed, S current sources are coupled to summing node 28 (where S is in the range of 0 to N). Of course, S may be equal to P. The S current sources collectively draw a reference signal from summing node 28, which creates a residue signal between voltage source 38 and summing node 28 representing a difference between the analog input signal and the reference signal. Furthermore, an M-bit first digital code, corresponding to the settings of switching circuit 40 (with S switches closed), and representing an approximation of the MSBs, is sent to logic circuit 18. Accordingly, the reference signal is associated with the first digital code; that is, the reference signal is the analog counterpart of the first digital code. Further details about operating current arrays in A/D converters are disclosed in U.S. application Ser. No. 08/529,703, filed Sep. 18, 1995, entitled "Analog-To-Digital Converter With Reduced Power And Area" [Vallancourt 4] which is incorporated herein by reference. See also D. W. J. Groeneveld et al., "A Self-Calibration Technique for Monolithic High-Resolution D/A Converters", *IEEE Journal of Solid-State Circuits*, Vol. 24, No. 6, December 1989. pp. 1517–1522, which is incorporated herein by reference.

It is critical to note that, had switching circuit 40 not been initialized to couple P current sources to summing node 28, as taught by the invention, then, as is conventional, a predetermined number of current sources, such as N/2, would be coupled to summing node 28 before coarse coifversion begins. For analog input signals corresponding to approximately N/2 current sources, the conventional approach would provide a relatively close match; however, for analog input signals closer to 0 current sources, or to N current sources, the conventional approach would provide a relatively poor match. The invention solves this problem by dynamically linking the coarse conversion initialization to the analog input signal.

It should also be noted that the present invention allows for skipping the incremental search entirely. That is, the P current sources may automatically provide the close match. The accuracy of the digital control signal as an approximation of the MSBs depends on several factors, including the accuracy of the scaling circuit, and the accuracy of the conversion circuit which converts the scaled signal into the digital control signal. These accuracies depend on the fabrication technology and the resolution of the digital output code. For instance, a 6-bit digital output code requiring a 3-bit digital control signal would more readily permit skipping the incremental search than a 14-bit digital output signal requiring a 7-bit digital control signal. Therefore, it is understood that the coarse conversion of the present invention may or may not include a search.

After the close match occurs, the residue signal is sampled by current copier 32. For ease of design, current copier 32 copies currents flowing out of it, but does not copy currents flowing into it. If current sensor 36 indicates a difference signal flowing into voltage source 38, then an additional current source is coupled to summing node 28. The process repeats until the difference signal flows from voltage source 38 to summing node 28. After the difference signal flows from voltage source 38 to summing node 28, however, a rapid increase in the analog input signal may cause the difference signal to change direction before current copier 32 samples the difference signal. Therefore, for added protection, over-ranging is performed by coupling J additional current sources to summing node 28 before sampling occurs. Preferably, J is in the range of 1 to 2, depending on factors such as sampling time and the allowable rate of change for the analog input signal. Furthermore, if a sufficiently high J (such as 2) is used, then it may not be necessary to measure the direction of the difference signal after the close match occurs. For illustration purposes, the S current sources and first digital code are determined in part by the over-ranging operation, if it is used. Any over-ranging error in the first digital code will be subsequently corrected by an over-ranging digital code. For convenience of explanation, the residue signal corresponds to the difference signal from voltage source 38 to summing node 28 after the close match and over-ranging occur.

At this point, switch 34 decouples voltage source 38 from summing node 28, and analog multiplexer 30 couples current copier 32 to summing node 28. As a result, the residue signal flows from current copier 32 to summing node 28, and sampling occurs. Further details about current copiers are disclosed in U.S. application Serial No. 08/523,703, filed Sep. 5, 1995, entitled "Current Copiers With Improved Accuracy" [Vallancourt 2]; and in S. J. Daubert et al., "Current Copier Cells", *Electronics Letters*, Vol. 24, No. 25, December 1988. pp. 1560–1562; which are incorporated herein by reference. Other sample and hold circuits known in the art may also be used as current copiers.

After current copier 32 samples the residue signal, analog multiplexer 26 decouples the analog input signal from summing node 28, and switch 34 couples voltage source 38 to summing node 28. As a result, the residue signal flows from current copier 32 through summing node 28 to voltage source 38. For fine conversion to occur, a remainder signal from summing node 28 to voltage source 38 should have a smaller current than the G current sources. The residue signal may have a larger current than the G current sources due to the over-ranging operation. Therefore, to offset the over-ranging operation, selected current sources (other than the G current sources) are coupled to summing node 28 to convert the residue signal into the remainder signal. For instance, switching circuit 40, in communication with current sensor 36, can couple selected current sources to summing node 28 so that the remainder signal has appropriate magnitude and direction. Alternatively, for illustration purposes, the J current sources are coupled to summing node 28. Accordingly, an over-ranging digital code associated with J is sent to logic circuit 18.

The fine conversion involves operating current adjustment circuit 44 in communication with current sensor 36 in response to the remainder signal. Switching circuit 40 couples current adjustment circuit 44 to summing node 28. The G current sources coupled to current adjustment circuit 44 are separate from the J current sources. Current adjustment circuit 44 adjusts the current between the G current sources and summing node 28 in order to reduce the remainder signal (or third difference signal between amplifier 76 and summing node 28). After the remainder signal is so reduced, the settings of current adjustment circuit 44 are used to provide an L-bit second digital code to logic circuit 18. Logic circuit 18, in response to the first and second digital codes, and the over-ranging digital code, provides an M+L bit digital output signal at output port 24. Preferably, M is equal to L.

Figure 3:
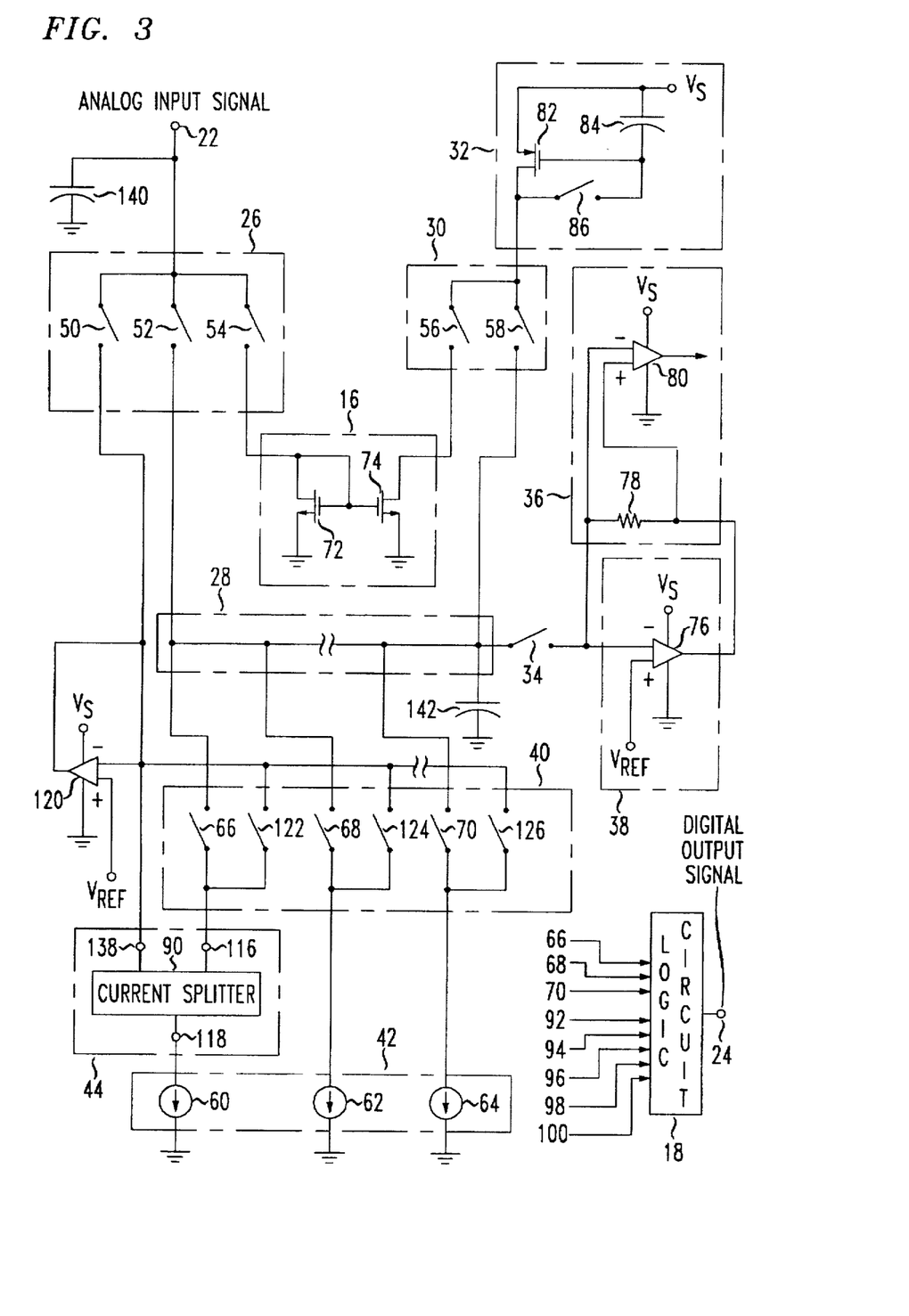
FIG. 3 is a simplified schematic diagram illustrating an embodiment of FIG. 2.

FIG. 3 is a simplified schematic diagram illustrating an embodiment of FIG. 2. For purposes of illustration, in this embodiment, N is equal to 32, G is equal to one, and each current source in current array 42 generates 10 microamps. Therefore, the analog input signal is limited to a range of 0 to 320 microamps, the scaled signal is limited to range of 0 to 10 microamps, and the remainder signal is limited to a range of 0 to 10 microamps. The 10-bit digital output word has an LSB that represents $(\frac{1}{2}^{10})(320$ microamps$)$ or 312.5 nanoamps.

Analog multiplexer 26 includes switches 50, 52 and 54 for routing the analog input signal. Generally, one of these switches is closed and the other two are open. Likewise, analog multiplexer 30 includes switches 56 and 58, and generally one of these switches is open and the other is closed. Current array 42 includes 32 separate 10 microamp current sources. The current sources can be implemented, for instance, using periodically refreshed current copiers. For purposes of clarity, three current sources 60, 62 and 64 are shown. Likewise, switching circuit 40 includes 32 separate switches for coupling and decoupling respective current sources to and from summing node 28. For purposes of clarity, switches 66, 68 and 70 are shown, corresponding to current sources 60, 62 and 64, respectively.

Scaling circuit 16 includes NMOS transistors 72 and 74 configured as a current mirror. Transistor 72 has a channel width-to-length ratio that is approximately 32 times larger than the channel width-to-length ratio of transistor 74. Therefore, the scaled signal linearly corresponds to approximately $\frac{1}{32}$ of the analog input signal. The current mirror arrangement for scaling circuit 16 permits the unidirectional current copier 32 to sample the scaled signal since the drain of transistor 74 sinks the scaled signal. Alternatively, if applying a moving scaled signal to summing node 28 is desired, then scaling circuit 16 can be configured as a current splitter (not shown) using PMOS transistors so that a drain of a PMOS transistor injects the scaled signal into summing node 28.

Voltage source 38 includes a high-gain, high input impedance operational amplifier 76 that maintains a substantially constant reference voltage $V_{ref}$ at its inverting terminal. Suitable values for power supply voltage $V_S$ and reference voltage $V_{ref}$ are 2.4 volts and 1.0 volts, respectively. Current sensor 36 includes resistive element 78 in parallel with comparator 80. Resistive element 78 and comparator 80 are coupled in series with the feedback loop of amplifier 76. Currents flowing from summing node 28 to amplifier 76 develop a voltage across resistive element 78 that causes comparator 80 to output a high signal, and currents flowing from amplifier 76 to summing node 28 develop a voltage across resistive element 78 that causes comparator 80 to output a low signal. Therefore, comparator 80 indicates the direction of current flow between summing node 28 and amplifier 76. Resistive element 78 may include clamping diodes which for large currents rapidly produce voltage swings of approximately 1 volt, and for which small currents are integrated by the parasitic capacitance of the clamping diodes to produce voltage swings of at least 25 millivolts in response to 312.5 nanoamp (one LSB) currents. The output of comparator 80 is coupled to a control circuit (not shown) which controls the settings of switching circuit 40 and current adjustment circuit 44.

Current copier 32 includes PMOS transistor 82, capacitor 84, and switch 86. Sampling the residue signal includes closing switch 52 to apply the analog input signal to summing node 28 while the S current sources are coupled to summing node 28, opening switch 34 to decouple amplifier 76 from summing node 28, closing switch 58 to couple the source of transistor 82 to summing node 28, and closing switch 86 to establish the appropriate gate-to-source voltage at transistor 82. That is, capacitor 84 charges to a value to support the residue signal flowing from voltage source $V_S$ through transistor 82 to summing node 28. Switch 86 is then opened and transistor 82 supplies the residue signal back to summing node 28. Preferably, current copier 32 can sample and hold currents of at least 30 microamps.

Figure 4:
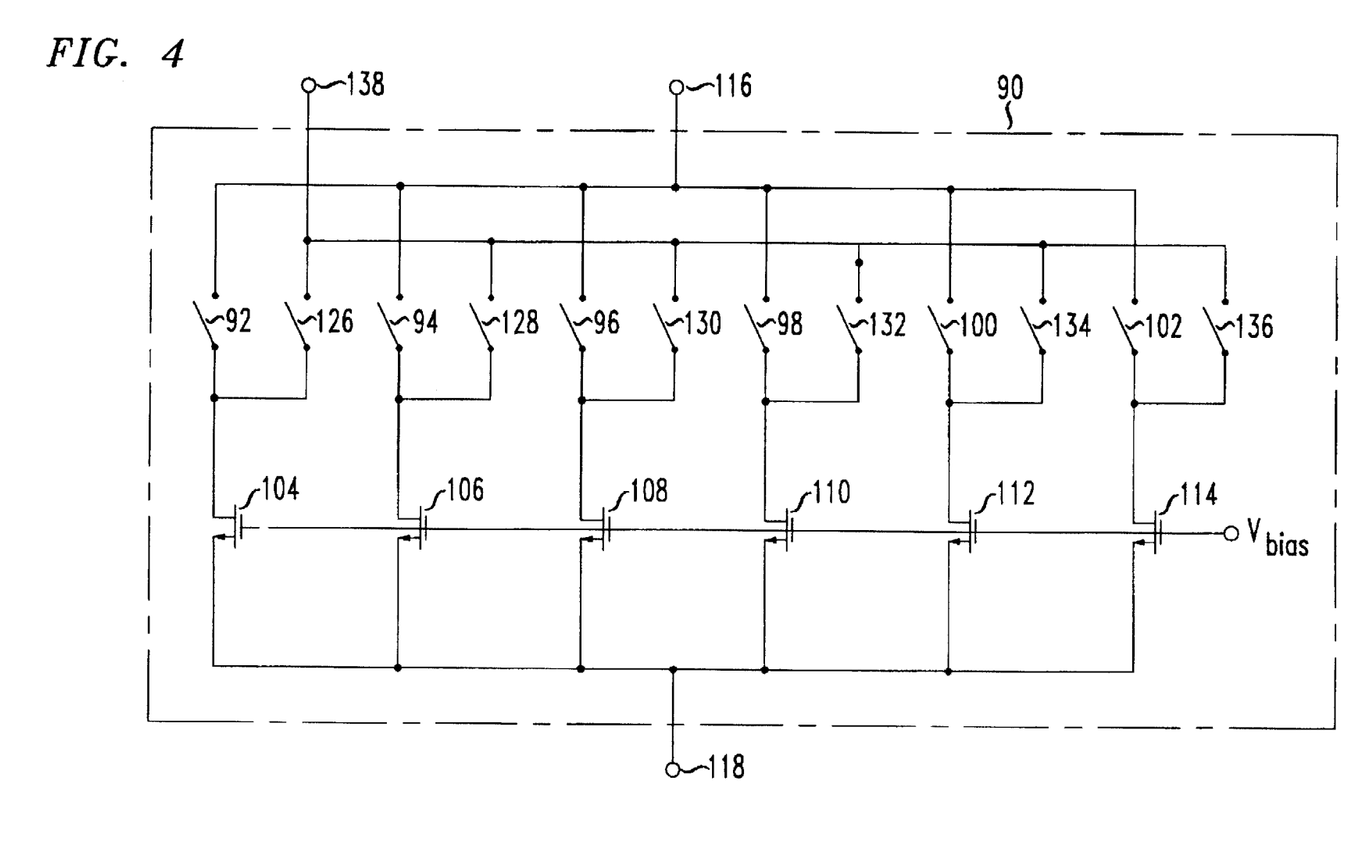
FIG. 4 is a simplified schematic diagram illustrating the current splitter used in FIG. 3.

Current adjustment circuit 44 includes a binary-weighted current splitter 90 for adjusting the current between current source 60 and summing node 28. FIG. 4 is a simplified schematic diagram illustrating the current splitter 90. Current splitter 90 comprises switches 92, 94, 96, 98, 100 and 102 connected to NMOS transistors 104, 106, 108, 110, 112 and 114, respectively. Transistors 104-114 provide binary-weighted current sources. Transistor 104 has a channel width-to-length ratio that is approximately 2 times larger than that of transistor 106, 4 times larger than that of transistor 108, 8 times larger than that of transistor 110, 16 times larger than that of transistor 112, and 16 times larger than that of transistor 114. That gates of transistors 104-114 are commonly connected to biasing voltage $V_{bias}$. The drains of transistors 104-114 are commonly connected to switch 66 at node 116. The sources of transistors 104-114 are commonly connected to current source 60 at node 118.

When switch 66 is closed, closing switch 92 allows current source 60 to draw 5 microamps from summing node 28, closing switch 94 allows current source 60 to draw 2.5 microamps from summing node 28, closing switch 96 allows current source 60 to draw 1.25 microamps from summing node 28, closing switch 98 allows current source 60 to draw 0.625 microamps from summing node 28, closing switch 100 allows current source 60 to draw 0.3125 microamps from summing node 28, and closing switch 102 allows current source 60 to draw 0.3125 microamps from summing node 28. For instance, closing switches 92-102 results in current source 60 drawing the full 10 microamps from summing node 28, closing switches 92 and 94 while opening switches 96-102 results in current source 60 drawing 7.5 microamps from summing node 28, and so on. During coarse conversion, current splitter 90 is set to unity (i.e. switches 92–102 are closed) so that when switch 66 is closed, current source 60 draws the full 10 microamps from summing node 28.

The preferred operation of current splitter 90 includes controlling switches 92–102 by successive approximation in communication with the output of comparator 80. Therefore, for each digital output signal, current splitter 90 performs successive approximation twice, once in response to the scaled signal, and once in response to the remainder signal. A 5-bit digital control signal corresponds to the settings of switches 92–100 after successive approximation in response to the scaled signal, and a 5-bit second digital code corresponds to the settings of switches 92–100 after successive approximation in response to the remainder signal. The successive approximation may determine either the smallest digital signal that exceeds the analog signal being approximated, or the largest digital signal that is less than the analog signal being approximated. Further details about successive approximation circuits for approximating a moving signal are disclosed in U.S. application Ser. No. 08/349,153, filed Dec. 2, 1994, entitled "Low Noise Non-Sampled Successive Approximation" which is incorporated herein by reference.

Although not shown, a decoder is used to convert the settings of switches 92–100 (representing $25^5$ or 32 possible combinations) into 32 separate control signals for opening and closing the 32 respective switches (shown as switches 66, 68 and 70) in switching circuit 40 that coupled and decouple the 32 respective current sources to and from summing node 28. Likewise, an encoder (not shown) is used to convert the settings of these same 32 switches into the 5-bit first digital code that is send to logic circuit 18.

Logic circuit 18 provides a 10-bit digital output signal consisting of 5 MSB positions and 5 LSB positions. Logic circuit 18 stores the first digital code in the 5 MSB positions. Logic circuit 18 subtracts the over-ranging digital code from the 5 MSB positions. Logic circuit also subtracts the second digital code from the 5 LSB positions. This produces the digital output signal.

Amplifier 120 provides a current-dump. Preferably, amplifier 120 is a high-gain, high input impedance operational amplifier, similar to amplifier 76, that maintains a substantially constant voltage $V_{ref}$ at its inverting terminal. When the analog input signal is not required at scaling circuit 16 or at summing node 28, switch 50 routes the analog input signal to amplifier 120 so that the analog input signal sees a substantially constant input impedance. Furthermore, if, during coarse conversion, the current sources decoupled from summing node 28 were turned off, the turned off current sources would acquire large parasitic capacitances. A relatively large amplifier 76 would be necessary to maintain a substantially constant voltage $V_{ref}$ as the turned off current sources were coupled to summing node 28. Instead, during coarse conversion, the current sources are routed between amplifier 76 and amplifier 120. That is, those current sources that are decoupled from summing node 28 are coupled to amplifier 120 by switching circuit 40. For instance, switches 122, 124 and 126 are for coupling and decoupling current sources 60, 62 and 64, respectively, to and from amplifier 120. In this manner, during coarse conversion, the current sources are coupled to voltage $V_{ref}$ either by amplifier 76 or amplifier 120. After the coarse conversion is completed, the current sources not involved with the fine conversion are generally turned off to conserve power, except for calibration purposes. For instance, 8 current sources are calibrated after each A/D conversion, so that each of the 32 current sources is calibrated after 4 A/D conversions.

Similarly, switches 126, 128, 130, 132, 134 and 136 (FIG. 4) are for coupling and decoupling transistors 104, 106, 108, 110, 112 and 114, respectively, to and from amplifier 120 at node 138. When switch 66 is closed (and switch 122 is opened) and, for instance, switches 92–94 and 130–136 are closed, and switches 96–102 and 126–128 are opened, then current source 60 draws (5+2.5) or 7.5 microamps from summing node 28, and (1.25+0.625+0.3125+0.3125) or 2.5 microamps from amplifier 120.

Distributed capacitances 140 and 142 are not tangible components. Distributed capacitance 140 represents a distributed capacitance associated with a bonding pad (on the surface of an integrated circuit chip embodying the invention) and an external current supply (which supplies the analog input signal to the bonding pad) that are coupled to input port 22. Likewise, distributed capacitance 142 represents a distributed capacitance associated all the current sources in current array 42. Exposing amplifier 76 to capacitances 140 and/or 142 increases power consumption since amplifier 76 must draw additional bias current from voltage source $V_s$. The relatively short incremental search during coarse conversion process reduces the length of time amplifier 76 is exposed to capacitances 140 and 142, and therefore reduces power consumption. Furthermore, if the coarse conversion is performed without the incremental search, then amplifier 76 need not be exposed to capacitances 140 and 142, which not only reduces power dissipation, but also permits a considerably smaller amplifier 76.

As an illustration, suppose a 187.5 microamp analog input signal is applied. A scaled signal of (187.5/32) or 5.859 microamps flows from summing node 28 to amplifier 76. Current splitter 90 performs successive approximations to draw the smallest current from summing node 28 through current source 60 that is greater than or equal to 5.859 microamps. Closing switches 92, 98 and 100 while opening switches 94, 96 and 102 draws (5+0.625+0.3125) or 5.938 microamps from summing node 28 and reduces the difference current (from amplifier 76 to summing node 28) to 0.079 microamps (which is less than the 0.3125 microamp quantization error). A digital control signal of 10011 corresponds to switches 92, 98 and 100 being closed. The digital control signal is also an approximation of the smallest 5 MSBs that are larger than the analog input signal. That is, the digital control signal of 10011 also represents (160+20+10) or 190 microamps. Accordingly, the digital control signal initializes the coarse conversion by coupling 19 of the 10 microamp current sources to summing node 28. It is assumed that the analog input signal remains 187.5 microamps. This creates a difference signal of 2.5 microamps flowing from amplifier 76 to summing node 28. It is also assumed that the incremental search is skipped (or, alternatively, the incremental search toggles the 19th current source to and from summing node 28 and finishes with the 19th current source coupled to summing node 28). Two additional current sources are coupled to summing node 28 for over-ranging purposes, to create a difference signal (designated a residue signal) of (20+2.5) or 22.5 microamps flowing from amplifier 76 to summing node 28. A first digital code of 10101 represents the (16+4+1) or 21 current sources coupled to summing node 28. The residue signal is sampled by current copier 32, and is then applied by current copier 32 to summing node 28. Two current sources (other than current source 60) are coupled to summing node 28 to provide a remainder signal of 2.5 microamps (i.e., less than 10 microamps) flowing from summing node 28 to amplifier 76. An over-ranging digital code of 00010 represents the two coupled current sources. Current splitter 90 once again performs successive approximation to draw the smallest current from summing node 28 through current source 60 that is greater than or equal to 2.5 microamps. Closing switch 94 while opening switches 92 and 96–102 draws 2.5 microamps from summing node 28 through current source 60 and reduces the remainder signal to zero. A second digital code of 01000 represents switch 94 being closed. In logic circuit 18, the first digital code is stored in a 10-bit addend register (not shown) such that the first digital code is placed in the 5 MSB positions, and the 5 LSB positions are padded with zeros. This provides a digital code of 1010100000. The over-ranging code is stored in a 10-bit subtrahend register (not shown) such that the over-ranging digital code is placed in the 5 MSB positions and the 5 LSB positions are padded with zeros. The over-ranging digital code is then subtracted from the first digital code to provide an intermediate result as follows:

```
 1001100000
-0000001000
 1001011000
```

Thereafter, the second digital code stored in the subtrahend register such that the second digital code is placed in the 5 LSB positions with the 5 MSB positions padded with zeros. The second digital code is then subtracted from the intermediate result to yield the digital output code as follows:

```
 1001100000
-0000001000
 1001011000
```

The digital output code represents (160+20+5+2.5) or 187.5 microamps. Advantageously, the number of current sources used for over-ranging does not affect the digital output code since changes to the first digital code are offset by the over-ranging digital code.

It is understood that the actual implementation of logic circuit 18 is largely a matter of design choice. For instance, a first digital code of 10101 (not modified by over-ranging) could be stored in a first register, the over-ranging digital code of 00010 could be stored in a second register, coupling the two current sources to provide the 2.5 microamp remainder signal could result in correction code of 00010 which is subtracted from the over-ranging digital code to provide an intermediate code of 00000, the intermediate code could be subtracted from the first digital code to produce an intermediate result, and finally the second digital code could be subtracted from the intermediate result.

When the fine conversion circuit provides the digital control signal, the fine conversion circuit also serves as an initialization conversion circuit. However, as mentioned above, a separate initialization conversion circuit can be used instead of the fine conversion circuit to provide the digital control signal. That is, a separate initialization conversion circuit can provide the digital control signal independently of the fine conversion circuit. For instance, the separate initialization circuit may perform faster yet less accurate conversion than the fine conversion circuit. A suitable separate initialization circuit is disclosed, for instance, in U.S. application Ser. No. 08/459920, flied Jun. 2, 1995, entitled "Current-Mode Parallel Analog-to-Digital Converter". Alternatively, the A/D converter of Ser. No. 08/459920 may provide both the fine and initialization conversion circuits.

It should, of course, be understood that while the present invention has been described in terms of several illustrative embodiments, other arrangements and methods of operation will be apparent to those of ordinary skill in the art. For example, while the embodiments of the invention have been described in reference to discrete functional elements, the function of one or more of these elements can be provided by one or more appropriately programmed general-purpose processors, or special-purpose integrated circuits, or digital signal processors, or an analog or hybrid counterpart of any of these devices. The invention is well suited for fabrication in a single integrated circuit chip. Finally, the inventive concept can be used in virtually any application where analog-to-digital conversion is desired. Therefore, the invention should be limited only by the spirit and scope of the appended claims.

The invention claimed is:

1. A method of converting an analog input signal into a digital output signal, comprising the steps of:

applying the input signal to a scaling circuit to provide an analog scaled signal with a smaller amplitude than the input signal;

applying the scaled signal to a fine conversion circuit to provide a digital control signal;

applying the digital control signal to a coarse conversion circuit to initialize the coarse conversion circuit, said coarse conversion circuit including N substantially matched current sources and a switching circuit including N switches for coupling and decoupling respective current sources to and from a summing node;

applying the input signal to the coarse conversion circuit after initializing the coarse conversion circuit to provide a first digital code and an analog reference signal associated with the first digital code;

providing an analog remainder signal determined at least in part by a difference between the input signal and the reference signal;

applying the remainder signal to the fine conversion circuit to provide a second digital code; and applying at least the first and second digital codes to a logic circuit to provide the output signal, wherein providing the first digital code includes applying the input signal to the summing node, coupling P current sources to the summing node, where P is corresponds to the digital control signal, and coupling a voltage source to the summing node, to provide a difference signal between the voltage source and the summing node representing a difference between the input signal and the P current sources.

2. The method of claim 1, further including coupling J current sources to the summing node to provide over-ranging.

3. The method of claim 2 wherein the P+J current sources apply the reference signal to the summing node to provide a residue signal between the voltage source and the summing node representing the difference between the input signal and the reference signal, and the first digital code corresponds to settings of the switching circuit.

4. The method of claim 2, further including operating the switching circuit in response to the difference signal to perform an incremental search to couple S–J current sources to the summing node, wherein the S current sources apply the reference signal to the summing node to provide a residue signal between the voltage source and the summing node representing the difference between the input signal and the reference signal, and the first digital code corresponds to settings of the switching circuit.

5. A method of converting an analog input signal into a digital output signal, comparing the steps of:

applying the input signal to a scaling circuit to provide an analog scaled signal with a smaller amplitude than the input signal;

applying the scaled signal to a fine conversion circuit to provide a digital control signal;

applying the digital control signal to a coarse conversion circuit to initialize the coarse conversion circuit, said coarse conversion circuit including N substantially matched current sources and a switching circuit including N switches for coupling and decoupling respective current sources to and from a summing node;

applying the input signal to the coarse conversion circuit after initializing the coarse conversion circuit to provide a first digital code and an analog reference signal associated with the first digital code;

providing an analog remainder signal determined at least in part by a difference between the input signal and the reference signal;

applying the remainder signal to the fine conversion circuit to provide a second digital code; and applying at least the first and second digital codes to a logic circuit to provide the output signal, wherein providing the remainder signal includes applying the input signal to the summing node, applying the reference signal to the summing node by coupling first selected current sources to the summing node, and coupling a voltage source to the summing node, to provide a residue signal between the voltage source and the summing node representing the difference between the input signal and the reference signal, decoupling the voltage source from the summing node and coupling a current copier to the summing node so that the current copier samples the residue signal, decoupling the input signal from the summing node, coupling the voltage source to the summing node, and applying the residue signal from the current copier to the summing node, and operating the switching circuit to couple second selected current sources to the summing node to provide the remainder signal between the voltage source and the summing node.

6. A method of applying the input signal to a scaling circuit to provide an analog scaled signal with a smaller amplitude than the input signal;

applying the scaled signal to a fine conversion circuit to provide a digital control signal;

applying the digital control signal to a coarse conversion circuit to initialize the coarse conversion circuit, said coarse conversion circuit including N substantially matched current sources and a switching circuit including N switches for coupling and decoupling respective current sources to and from a summing node;

applying the input signal to the coarse conversion circuit after initializing the coarse conversion circuit to provide a first digital code and an analog reference signal associated with the first digital code;

providing an analog remainder signal determined at least in part by a difference between the input signal and the reference signal;

applying the remainder signal to the fine conversion circuit to provide a second digital code; and applying at least the first and second digital codes to a logic circuit to provide the output signal, wherein the fine conversion circuit includes a current adjustment circuit for adjusting a current between G current sources and the summing node.

7. The method of claim 6 wherein providing the digital control signal includes applying the scaled signal to the summing node, coupling the current adjustment circuit to the summing node, coupling a voltage source to the summing node to provide a difference signal between the voltage source and the summing node representing a difference between the scaled signal and the current between the G current sources and the summing node, and operating the current adjustment circuit so as to reduce the difference signal, such that the digital control signal corresponds to settings of the current adjustment circuit.

8. The method of claim 6 wherein providing the second digital code includes coupling a voltage source to the summing node and applying the remainder signal between the voltage source and the summing node, coupling the current adjustment circuit to the summing node, and operating the current adjustment circuit so as to reduce the remainder signal, such that the second digital code corresponds to settings of the current adjustment circuit.

9. The method of claim 8 wherein the remainder signal has a smaller current than the G current sources.

10. The method of claim 9 wherein the current adjustment circuit is a binary-weighted current splitter operated by performing successive approximations and G is equal to 1.

11. A method of converting an analog input signal into a digital output signal in an analog-to-digital converter including N substantially matched constant current sources, a summing node, a switching circuit including N switches for coupling and decoupling respective current sources to and from the summing node, a substantially constant voltage source, and a current splitter coupled between one of the current sources and the summing node, the method comprising the steps of:

applying the input signal to the scaling circuit to provide an analog scaled signal with a current amplitude linearly corresponding to the input signal divided by approximately N;

applying the scaled signal to the summing node while the voltage source and the current splitter are coupled to the summing node to provide a first difference signal between the voltage source and the summing node representing a difference between the scaled signal and a current through the current splitter;

operating the current splitter to reduce the first difference signal such that a digital control signal, representing an approximation of most significant bits (MSBs) of the output signal, corresponds to settings of the current splitter;

decoupling the scaled signal from the summing node;

applying the digital control signal to the switching circuit to couple P current sources to the summing node;

applying the input signal to the summing node while the voltage source and the P current sources are coupled to the summing node to provide a second difference signal between the voltage source and the summing node representing a difference between the input signal and the P current sources;

coupling first selected current sources to the summing node to couple a reference signal to summing node such that a first digital code associated with the reference signal corresponds to settings of the switching circuit;

providing a residue signal between the voltage source and the summing node representing a difference between the input signal and the reference signal;

decoupling the voltage source from the summing node and coupling a current copier to the summing node such that the current copier samples the residue signal;

decoupling the input signal from the summing node, coupling the voltage source to the summing node, and coupling the current copier to the summing node such that the current copier applies the residue signal to the summing node;

coupling second selected current sources other than the one current source to the summing node such that a remainder signal between the voltage source and the summing node, determined at least in part by a difference between the input signal and the reference signal, has a smaller current than the one current source;

coupling the current splitter to the summing node;

operating the current splitter so as to reduce the remainder signal such that a second digital code corresponds to settings of the current splitter; and determining the output signal based at least in part on the first and second digital codes.

12. The method of claim 11 wherein the digital control signal has a length of M bits, the first digital code has a length of M bits, the second digital code has a length of M bits, the output signal has a length of 2 M bits, and N is equal to $2^M$.

13. The method of claim 11 wherein operating the current splitter includes performing successive approximations with a binary-weighted current splitter.

14. A method of converting an analog input signal into a digital output signal, comprising the steps of:

scaling the analog input signal to create a scaled analog signal;

introducing the scaled analog signal to a fine conversion circuit to create a first output of the fine conversion circuit;

applying an analog remainder signal to the fine conversion circuit to create a second output of the fine conversion circuit; and creating the digital output signal based on the first output of the fine conversion circuit and the second output of the fine conversion circuit.

15. A method as recited in claim 14, wherein the step of creating the digital output signal includes setting a group of upper bits of the digital output signal based on the first output of the fine conversion circuit, and setting a group of lower bits of the digital output signal based on the second output of the fine conversion circuit.

16. A method as recited in claim 15, wherein the group of upper bits are set to be equal to the first output of the fine conversion circuit.

17. A method as recited in claim 16, wherein the group of lower bits are set to be equal to the second output of the fine conversion circuit.

18. A method as recited in claim 14, further comprising the step of creating the analog remainder signal by comparing the first output of the fine conversion circuit to the analog input signal.

19. A method as recited in claim 18, wherein the comparing step includes applying the first output of the fine conversion circuit to a coarse conversion circuit, applying the analog input signal to the coarse conversion circuit, and outputting the analog remainder signal being from the coarse conversion circuit.

20. An analog-to-digital converter, comprising:

a scaling circuit adapted to receive an analog input signal and output a scaled analog signal;

a fine converter adapted to receive the scaled analog signal and produce a first output therefrom, and to receive a remainder signal and produce a second output therefrom;

a circuit adapted to create the remainder signal based on the analog input signal and the first output of the fine converter; and an output element adapted to create a digital output signal based on the first output of the fine converter and the second output of the fine converter.

21. An analog-to-digital converter as recited in claim 20, wherein the circuit is adapted to create the remainder signal through a comparison of the analog input signal and the first output of the fine converter.

22. An analog-to-digital converter as recited in claim 20, wherein the output element is adapted to create the digital output signal by using the second output of the fine converter as a group of lower bits of the digital output signal.

23. An analog-to-digital converter as recited in claim 22, wherein the output element is adapted to create the digital output signal by basing a group of upper bits of the digital output signal on the first output of the fine converter.

24. An analog-to-digital converter as recited in claim 23, wherein the output element is adapted to create the digital output signal by using the first output of the fine converter as the group of upper bits of the digital output signal.

25. An analog-to-digital converter as recited in claim 20, further comprising a coarse converter adapted to receive the first output of the fine converter and provide information related to the first output of the fine converter to the circuit adapted to create the remainder signal.

* * * * *